(12) United States Patent
Yun et al.

(10) Patent No.: US 8,238,179 B2
(45) Date of Patent: Aug. 7, 2012

(54) DEVICE AND METHOD FOR GENERATING TEST MODE SIGNAL

(75) Inventors: Tae Sik Yun, Ichon-shi (KR); Won Woong Seok, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 186 days.

(21) Appl. No.: 12/836,526

(22) Filed: Jul. 14, 2010

(65) Prior Publication Data
US 2011/0158015 A1  Jun. 30, 2011

(30) Foreign Application Priority Data
Dec. 28, 2009  (KR) ........................ 10-2009-0131782

(51) Int. Cl.
*G11C 7/00* (2006.01)
(52) U.S. Cl. ........................................ 365/201; 365/191
(58) Field of Classification Search .................. 365/201
See application file for complete search history.

(56) References Cited

U.S. PATENT DOCUMENTS

| | | |
|---|---|---|
| 5,263,031 A | 11/1993 | Inoue |
| 5,687,180 A | 11/1997 | Kawasaki |
| 5,901,105 A | 5/1999 | Ong et al. |
| 6,940,765 B2 | 9/2005 | Kyung |
| 6,950,357 B2 * | 9/2005 | Do ................................ 365/201 |
| 7,881,136 B2 * | 2/2011 | Kim .............................. 365/201 |
| 8,122,306 B2 * | 2/2012 | Seo .............................. 714/718 |
| 2010/0032669 A1 * | 2/2010 | An et al. ......................... 257/48 |
| 2011/0025364 A1 * | 2/2011 | Yun ........................... 324/762.01 |

FOREIGN PATENT DOCUMENTS

| | | |
|---|---|---|
| JP | 09-106698 | 4/1997 |
| JP | 2003-273232 A | 9/2003 |
| JP | 2005-235364 A | 2/2005 |
| JP | 2005-071582 | 3/2005 |
| JP | 2008-164601 A | 7/2008 |
| KR | 1020110035751 A | 6/2011 |

* cited by examiner

*Primary Examiner* — Son Mai
(74) *Attorney, Agent, or Firm* — William Park & Associates Ltd.

(57) ABSTRACT

A test mode signal generation device includes a pulse address generation unit configured to convert test address signals into pulse signals and generate pulse address signals, a pulse address split unit configured to generate converted test address signals in response to the pulse address signals, and a test mode signal generation unit configured to generate a test mode signal in response to the converted test address signals.

26 Claims, 8 Drawing Sheets

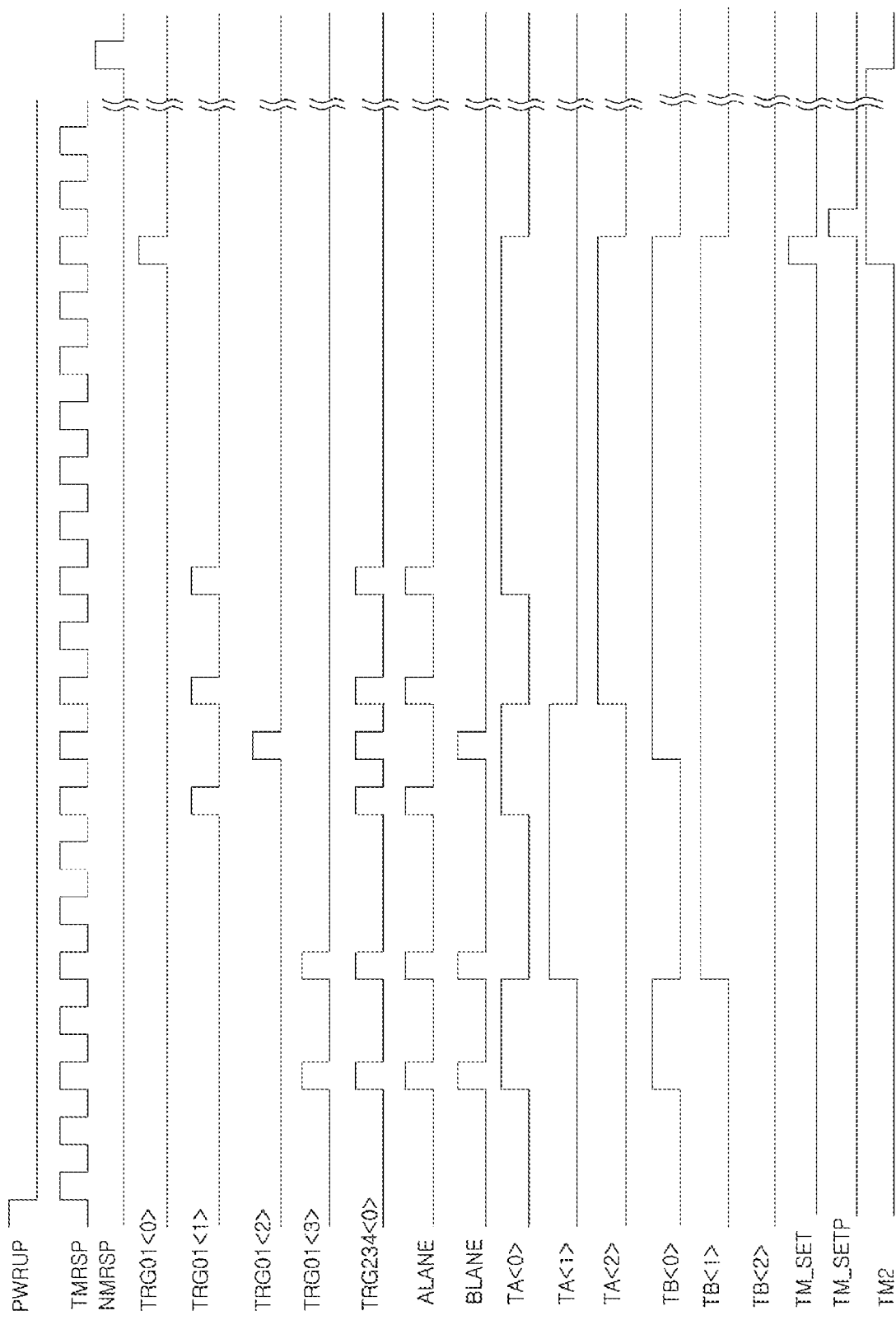

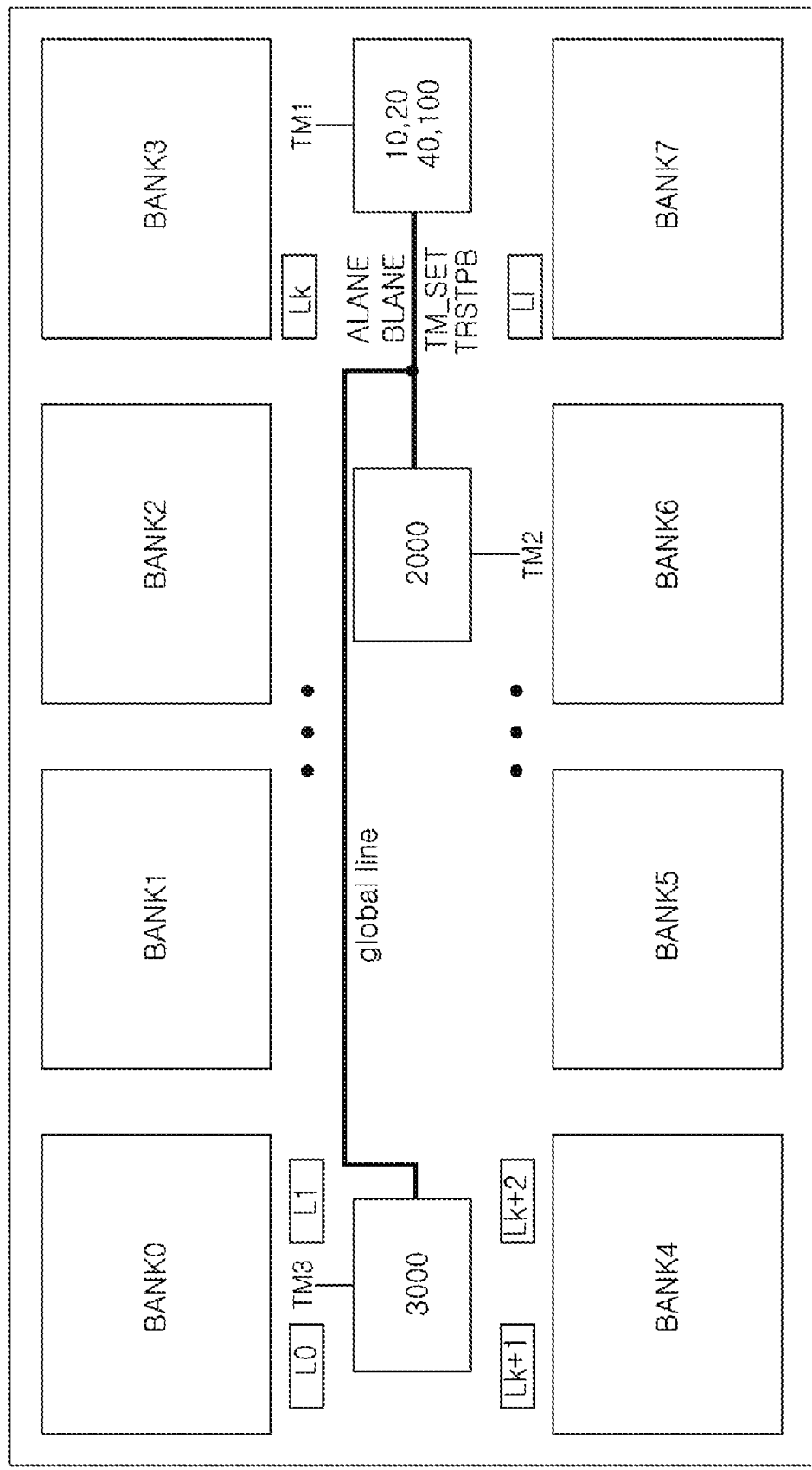

000 # DEVICE AND METHOD FOR GENERATING TEST MODE SIGNAL

CROSS-REFERENCE TO RELATED APPLICATION

The present application claims priority under 35 U.S.C. §119(a) to Korean Application No. 10-2009-0131782, filed on Dec. 28, 2009, in the Korean Intellectual Property Office, which is incorporated herein by reference in its entirety as if set forth in full.

BACKGROUND

1. Technical Field

The present invention relates to a semiconductor memory apparatus, and more particularly, to a test mode signal generation device which generates a test mode signal from address signals. 2. Related Art In order to guarantee the reliability of a semiconductor memory apparatus, various tests are performed on the semiconductor memory apparatus during its manufacture or, before end products are put on the market. Since fields for testing the performance of a semiconductor memory apparatus are diverse, a plurality of test modes are established, and tests of the semiconductor memory apparatus are performed based on pre-established test modes. In general, a semiconductor memory apparatus generates test mode signals for entry to specified test modes by combining address signals.

FIG. 1 is a block diagram schematically illustrating the configuration of a conventional test mode signal generation device. Referring to FIG. 1, a conventional test mode signal generation device includes a control unit 10, an address decoder 20, and a test mode signal generation unit 30. The control unit 10 receives address signals MREG<0:6>, a normal MRS signal NMRSP, a test MRS signal TMRSP, and a power-up signal PWRUP. The control unit 10 generates transmission address signals TMREG<0:6> according to the address signals MREG<0:6> when the test MRS signal TMRSP is enabled, and generates a reset signal TRSTPB using the normal MRS signal NMRSP and the power-up signal PWRUP. The address decoder 20 generates test address signals TRG01<0:3>, TRG234<0:7> and TRG56<0:3> by decoding the transmission address signals TMREG<0:6> inputted through the control unit 10. The test mode signal generation unit 30 receives the test address signals TRG01<0:3>, TRG234<0:7> and TRG56<0:3> and generates test mode signals TM. The test mode signal generation unit 30 has a plurality of signal generation sections 31, 32, 33 and 34, and generates a plurality of different test mode signals TM depending on the number of possible combinations of the test address signals TRG01<0:3>, TRG234<0:7>and TRG56<0:3>.

FIG. 2 is diagram illustrating a state in which the test mode signal generation device in FIG. 1 is disposed in a semiconductor apparatus. Referring to FIG. 2, a semiconductor apparatus includes 8 memory banks BANK0 through BANK7, and the test mode signal generation device in FIG. 1 is disposed in a peripheral area between the memory banks BANK0 through BANK7. The test mode signals TM generated by the test mode signal generation device are directly transmitted to logic circuits L0 through Lm and Lm+1 through Ln, which require the test mode signals TM, through global lines. In the case where the test mode signal generation device employs 7 address signals as shown in FIG. 1, 128 total test mode signals can be generated. Accordingly, in the case where the test mode signals are directly transmitted through the global lines, the number of global lines is necessarily 128. If such a large number of global lines are disposed in the peripheral area in which a number of circuits are provided for the normal operation of the semiconductor memory apparatus, wiring is complicated, and a layout margin decreases. Also, in the conventional test mode signal generation device, a limited number of test mode signals are generated according to a limited number of address signals.

SUMMARY

Various embodiments of the present invention comprise a test mode signal generation device which can generate a great number of test mode signals while decreasing the number of global lines.

In one aspect of the present invention, a test mode signal generation device comprises a pulse address generation unit configured to convert test address signals into pulse signals to generate pulse address signals, a pulse address split unit configured to generate converted test address signals in response to the pulse address signals, and a test mode signal generation unit configured to generate a test mode signal in response to the converted test address signals.

In another aspect of the present invention, a test mode signal generation device comprises a first test mode signal generation unit configured to generate a first test mode signal in response to test address signals, a pulse address generation unit configured to generate to pulse address signals in response to the test address signals, and a test mode signal generation block configured to generate a second test mode signal in response to the pulse address signals.

In another aspect of the present invention, a method of generating a test mode signal comprises converting test address signals into pulse address signals having a plurality of pulses depending on logic levels of the test address signals, transmitting the pulse address signals through global lines, generating converted test address signals in response to the pulse address signals transmitted through the global lines, and generating test mode signals in response to the converted test address signals.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 9 is a timing diagram illustrating operations of the test mode signal generation device in accordance with one embodiment of the present invention.

FIG. 10 is a diagram illustrating a state in which the test mode signal generation device in accordance with one embodiment of the present invention is disposed in a semiconductor apparatus.

DETAILED DESCRIPTION OF THE EMBODIMENTS

Figure 1:
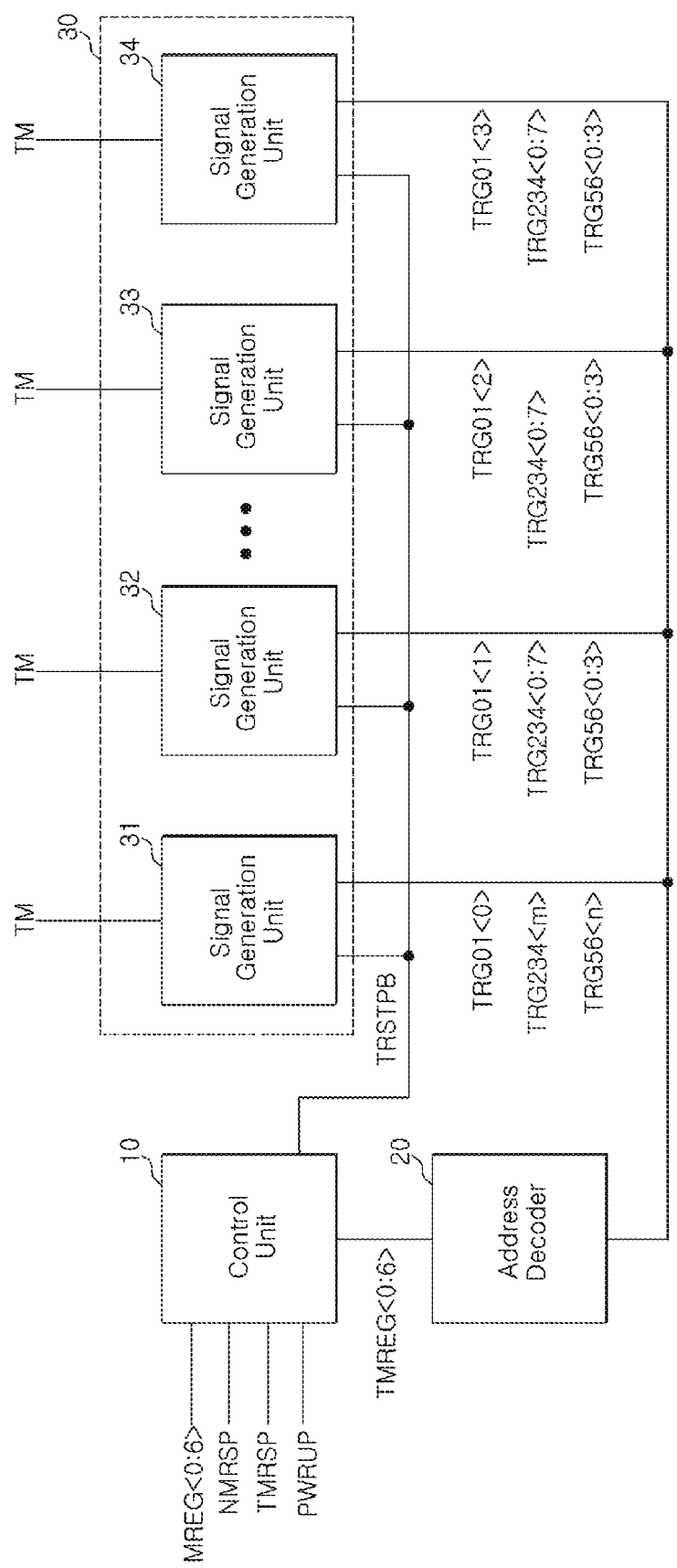
FIG. 1 is a block diagram schematically illustrating the configuration of a conventional test mode signal generation device.
Figure 2:
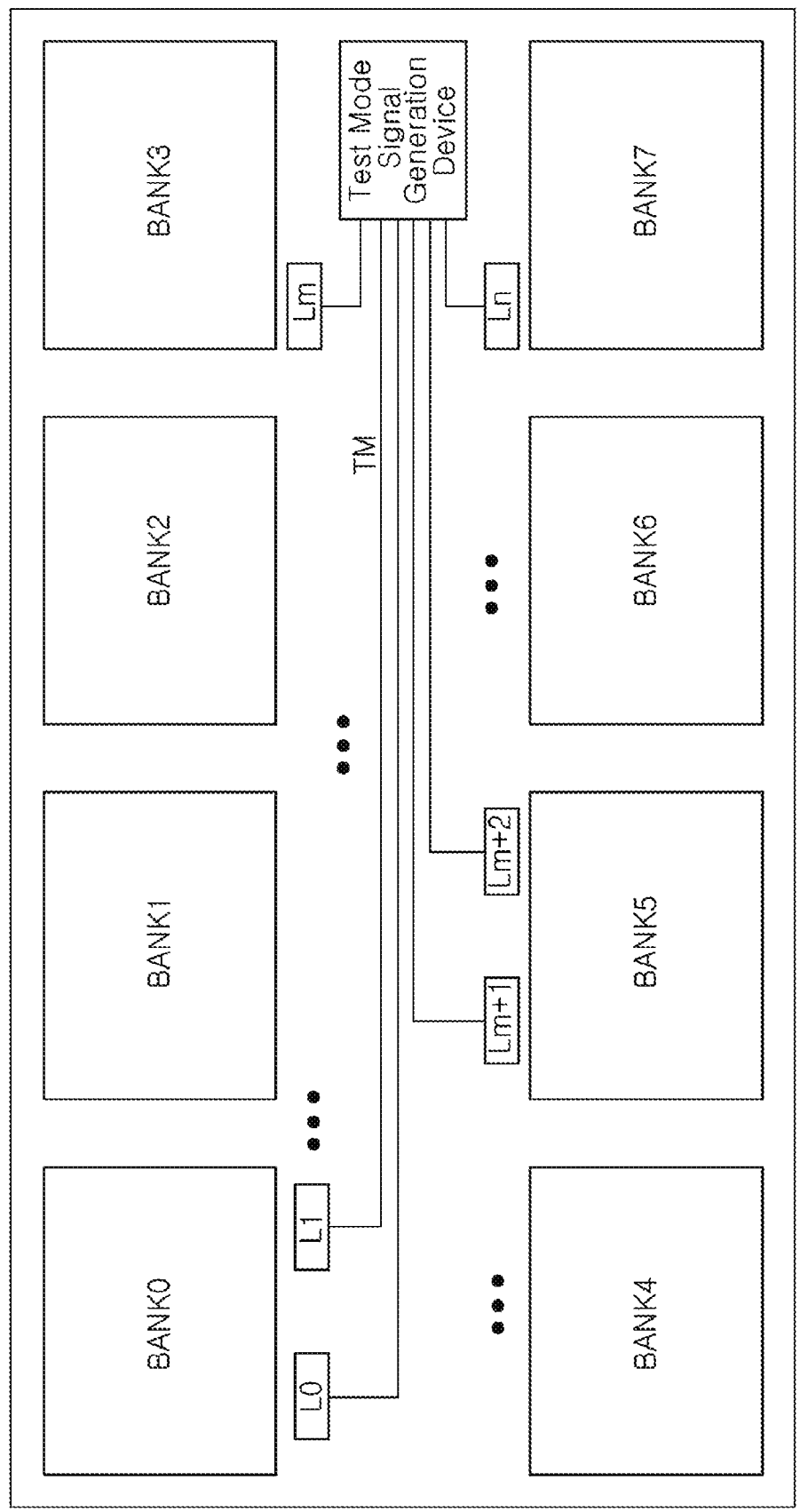
FIG. 2 is diagram illustrating a state in which the test mode signal generation device of FIG. 1 is disposed in a semiconductor apparatus.

Advantages and characteristics of the present invention and a method for achieving them will be apparent with reference to embodiments described below in addition to the accompanying drawings. However, the present invention is not limited to the exemplary embodiments described below but may be implemented in various forms. Therefore, the exemplary embodiments are provided to enable those skilled in the art to thoroughly understand the teaching of the present invention and to completely inform the scope of the present invention and the exemplary embodiment is just defined by the scope of the appended claims. Throughout the specification, like elements refer to like reference numerals.

Figure 3:
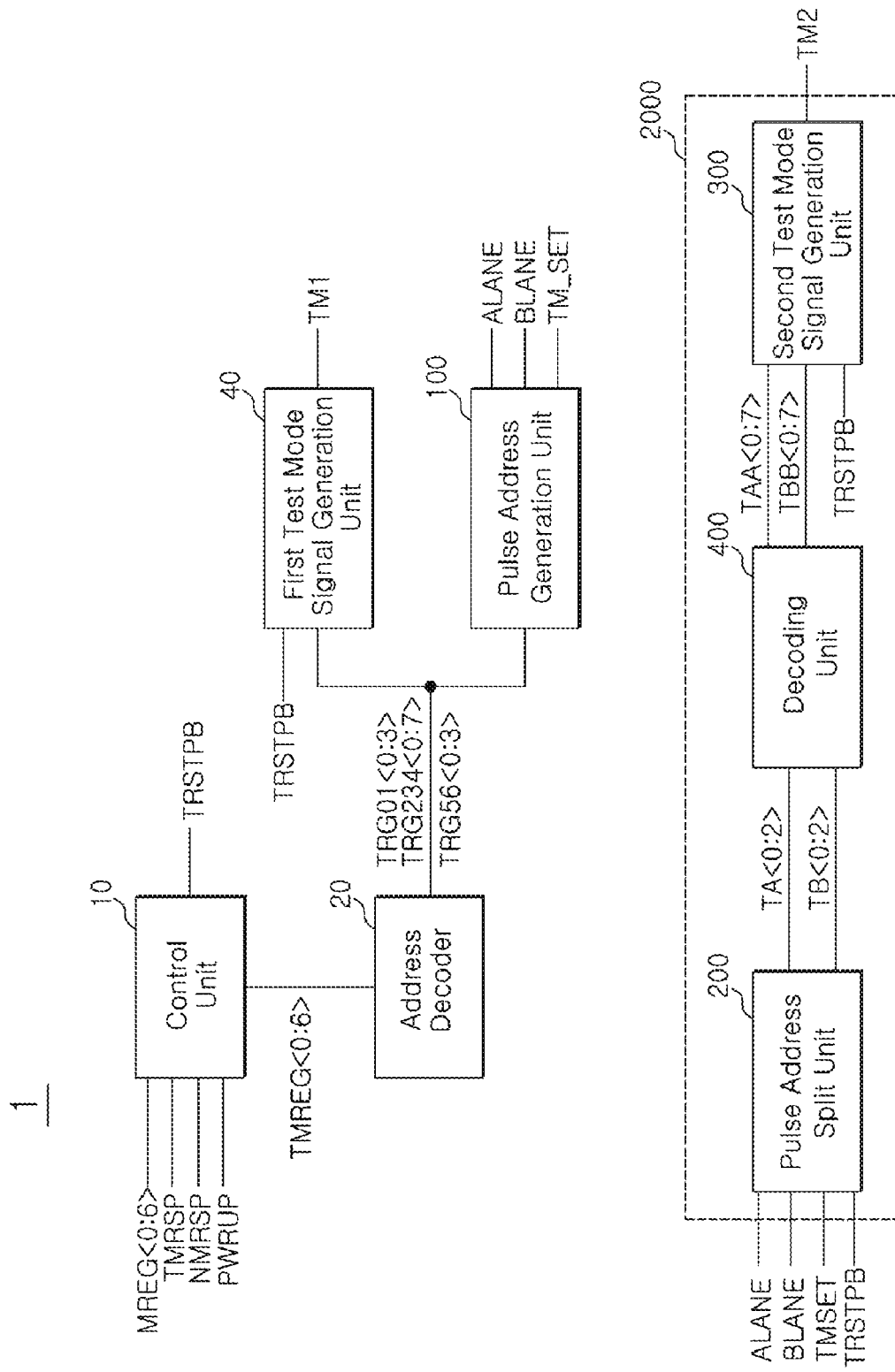
FIG. 3 is a block diagram schematically illustrating the configuration of a test mode signal generation device in accordance with one embodiment of the present invention.

FIG. 3 is a block diagram schematically illustrating the configuration of a test mode signal generation device in accordance with one embodiment of the present invention. Referring to FIG. 3, a test mode signal generation device 1 includes a first test mode signal generation unit 40, a pulse address generation unit 100, and a test mode signal generation block 2000. The first test mode signal generation unit 40 is configured to receive test address signals TRG01<0:3>, TRG234<0:7> and TRG56<0:3> and generate a first test mode signal TM1 according to the test address signals TRG01<0:3>, TRG234<0:7> and TRG56<0:3>. The first test mode signal generation unit 40 includes at least one signal generation unit and generates the first test mode signal TM1. The first test mode signal generation unit 40 disables the first test mode signal TM1 in response to a reset signal TRSTPB.

The pulse address generation unit 100 is configured to pulse address signals ALANE and BLANE in response to the test address signals TRG01<0:3>, TRG234<0:7> and TRG56<0:3>. The pulse address generation unit 100 generates the pulse address signals ALANE and BLANE, including a plurality of pulses, according to the logic levels of the test address signals TRG01<0:3>, TRG234<0:7> and TRG56<0:3>. That is to say, the pulse address generation unit 100 changes the number of pulses which are included in the pulse address signals ALANE and BLANE according to the test address signals TRG01<0:3>, TRG234<0:7> and TRG56<0:3>. Also, the pulse address generation unit 100 generates a control signal TM_SET by receiving the test address signals TRG01<0:3>, TRG234<0:7> and TRG56<0:3>.

The test mode signal generation block 2000 is configured to receive the pulse address signals ALANE and BLANE and generate a second test mode signal TM2. The test mode signal generation block 2000 includes a pulse address split unit 200 and a second test mode signal generation unit 300. The pulse address split unit 200 is configured to receive the pulse address signals ALANE and BLANE and generate converted test address signals TA<0:2> and TB<0:2>. The pulse address split unit 200 counts the number of pulses of the pulse address signals ALANE and BLANE and generates the converted test address signals TA<0:2> and TB<0:2>. The pulse address split unit 200 counts the number of pulses of the pulse address signals ALANE and BLANE and changes the logic levels of the converted test address signals TA<0:2> and TB<0:2>, depending on the counting results. Accordingly, the pulse address split unit 200 can generate the converted test address signals TA<0:2> and TB<0:2> which have substantially the same address information as the test address signals TRG01<0:3>, TRG234<0:7> and TRG56<0:3>. The pulse address split unit 200 receives the control signal TM_SET which is generated by the pulse address generation unit 100. The pulse address split unit 200 can count the number of pulses of the pulse address signals ALANE and BLANE in response to the control signal TM_SET.

The second test mode signal generation unit 300 is configured to generate the second test mode signal TM2 in response to the converted test address signals TA<0:2> and TB<0:2>. The second test mode signal generation block 2000 can further include a decoding unit 400. The decoding unit 400 is configured to receive and decode the converted test address signals TA<0:2> and TB<0:2> and output decoded signals. Therefore, the second test mode signal generation unit 300 receives output signals TAA<0:7> and TBB<0:7> of the decoding unit 400 which are obtained by decoding the converted test address signals TA<0:2> and TB<0:2> and generates the second test mode signal TM2. The second test mode signal generation unit 300 includes at least one signal generation unit which receives the output signals TAA<0:7> and TBB<0:7> of the decoding unit 400 and generates the second test mode signal TM2. The second test mode signal generation unit 300 receives the reset signal TRSTPB and disables the second test mode signal TM2 when the reset signal TRSTPB is enabled.

In FIG. 3, the test mode signal generation device 1 in accordance with one embodiment of the present invention further includes a control unit 10 and an address decoder 20. The control unit 10 receives address signals MREG<0:6>, a test MRS signal TMRSP, a normal MRS signal NMRSP, and a power-up signal PWRUP. The address signals MREG<0:6> are signals which are inputted to generate the test address signals TRG01<0:3>, TRG234<0:7> and TRG56<0:3>. For example, in the case of a semiconductor apparatus, the address signals MREG<0:6> comprise signals which can be inputted externally through pads disposed on the semiconductor apparatus. Thus, the logic levels of the test address signals TRG01<0:3>, TRG234<0:7> and TRG56<0:3> are changed depending on the address signals MREG<0:6>. The test MRS signal TMRSP is a signal which informs that a semiconductor apparatus having the test mode signal generation device 1 enters a test operation. The normal MRS signal NMRSP is a signal which the semiconductor apparatus does not enter the test operation, but a normal operation. Namely, the normal MRS signal NMRSP is a signal which instructs the semiconductor apparatus to exit a test mode. The power-up signal PWRUP is a signal which is used to initialize the semiconductor apparatus when power is stably applied to the semiconductor apparatus.

The control unit 10 is configured to receive the test MRS signal TMRSP and the address signals MREG<0:6> and generate the transmission address signals TMREG<0:6>. In other words, the control unit 10 is configured to output the address signals MREG<0:6> as the transmission address signals TMREG<0:6> when the test MRS signal TMRSP is inputted. The control unit 10 receives the normal MRS signal NMRSP and the power-up signal PWRUP and generates the reset signal TRSTPB. The control unit 10 enables the reset signal TRSTPB when the normal MRS signal NMRSP or the power-up signal PWRUP is enabled.

The address decoder 20 is configured to receive the transmission address signals TMREG<0:6> outputted from the control unit 10, decode the transmission address signals TMREG<0:6>, and generate the test address signals TRG01<0:3>, TRG234<0:7> and TRG56<0:3>.

Figure 4:
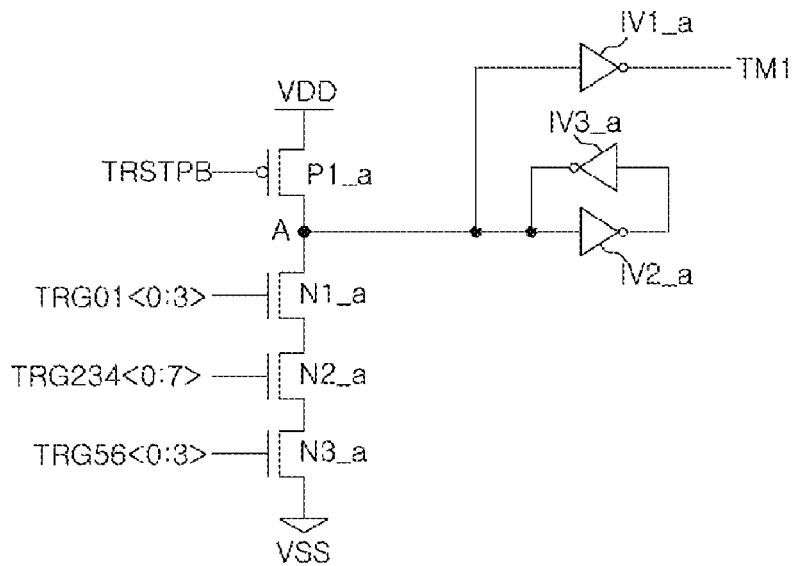
FIG. 4 is a diagram illustrating the configuration of one embodiment of a signal generation unit which constitutes a first test mode signal generation unit shown in FIG. 3.

FIG. 4 is a diagram illustrating the configuration of one embodiment of a signal generation unit which constitutes the first test mode signal generation unit shown in FIG. 3. Referring to FIG. 4, a signal generation unit 40A includes a first p-type metal oxide semiconductor (PMOS) transistor P1_a, first through third n-type metal oxide semiconductor (NMOS) transistors N1_a through N3_a, and first through third inverters IV1_a through IV3_a. The first PMOS transistor P1_a has the gate which is applied with the reset signal TRSTPB, the source terminal which is applied with an external supply voltage VDD, and the drain terminal which is connected with a first node A. The first through third NMOS transistors N1_a through N3_a have gates which receive the test address signals TRG01<0:3>, TRG234<0:7> and TRG56<0:3> respectively allocated thereto, and are connected in series between the first node A and a ground voltage terminal VSS. The first inverter IV1_a generates the signal obtained by inverting the voltage level of the first node A, as the first test mode signal TM1. The second and third inverters IV2_a and IV3_a form a latch structure and latch the voltage level of the first node A. The signal generation unit 40A is provided in a plural number depending on the number of combinations of the test address signals TRG01<0:3>, TRG234<0:7> and TRG56<0:3> and constitutes the first test mode signal generation unit 40.

Hence, the signal generation unit 40A can generate the first test mode signal TM1 when the allocated test address signals TRG01<0:3>, TRG234<0:7> and TRG56<0:3> have a high level, and can disable the first test mode signal TM1 when the reset signal TRSTPB is enabled.

Figure 5:
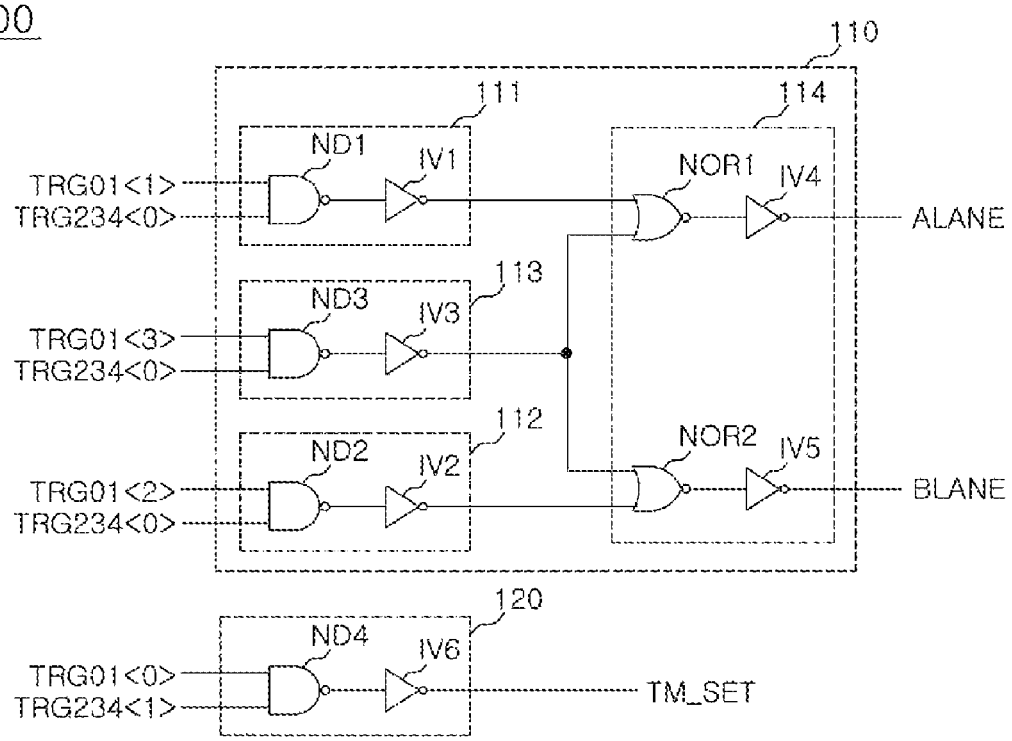
FIG. 5 is a diagram illustrating the configuration of one embodiment of a pulse address generation unit shown in FIG. 3.

FIG. 5 is a diagram schematically illustrating the configuration of an embodiment of the pulse address generation unit shown in FIG. 3. Referring to FIG. 5, the pulse address generation unit 100 includes an address generation section 110 and a control signal generation section 120. The address generation section 110 is configured to receive the test address signals TRG01<0:3> and TRG234<0> and generate the pulse address signals ALANE and BLANE depending on the logic levels of the test address signals TRG01<0:3> and TRG234<0>. The address generation section 110 changes the number of pulses of the pulse address signals ALANE and BLANE depending on the test address signals TRG01<0:3> and TRG234<0>. While it is described that the address generation section 110 receives partial test address signals TRG01<0:3> and TRG234<0>, the address generation section 110 can receive various combinations of the test address signals TRG01<0:3>, TRG234<0:7> and TRG56<0:3>. The configuration of the pulse address generation unit 100 shown in FIG. 5 can be added depending on the number of combinations of the received test address signals TRG01<0:3>, TRG234<0:7> and TRG56<0:3>.

The address generation section 110 receives the test address signals TRG01<0:3> and TRG234<0> and generates the first and second pulse address signals ALANE and BLANE. The address generation section 110 includes a first pulse trigger part 111, a second pulse trigger part 112, a third pulse trigger part 113, and a signal combining part 114. The first pulse trigger part 111 can increase the number of pulses of the first pulse address signal ALANE when allocated test address signals TRG01<1> and TRG234<0> have a high level. The second pulse trigger part 112 can increase the number of pulses of the second pulse address signal BLANE when allocated test address signals TRG01<2> and TRG234<0> have a high level. The third pulse trigger part 113 can increase the number of pulses of the first and second pulse address signals ALANE and BLANE when allocated test address signals TRG01<3> and TRG234<0> have a high level. The signal combining part 114 outputs the first and second pulse address signals ALANE and BLANE in response to the outputs of the first through third pulse trigger parts 111, 112 and 113.

The first pulse trigger part 111 includes a first NAND gate ND1 and a first inverter IV1. The first NAND gate ND1 receives the allocated test address signals TRG01<1> and TRG234<0>. The first inverter IV1 inverts the output of the first NAND gate ND1. Therefore, the first pulse trigger part 111 can output a signal of a high level when all of the allocated test address signals TRG01<1> and TRG234<0> have a high level. The second pulse trigger part 112 includes a second NAND gate ND2 and a second inverter IV2. The second NAND gate ND2 receives the allocated test address signals TRG01<2> and TRG234<0>. The second inverter IV2 inverts the output of the second NAND gate ND2. Therefore, the second pulse trigger part 112 can output a signal of a high level when all of the allocated test address signals TRG01<2> and TRG234<0> have a high level. The third pulse trigger part 113 includes a third NAND gate ND3 and a third inverter IV3, and outputs a signal of a high level when all of the allocated test address signals TRG01<3> and TRG234<0> have a high level.

The signal combining part 114 includes first and second NOR gates NOR1 and NOR2, and fourth and fifth inverters IV4 and IV5. The first NOR gate NOR1 receives the outputs of the first and third pulse trigger parts 111 and 113. The fourth inverter IV4 inverts the output of the first NOR gate NOR1 and outputs the first pulse address signal ALANE. The second NOR gate NOR2 receives the outputs of the second and third pulse trigger parts 112 and 113. The fifth inverter IV5 inverts the output of the second NOR gate NOR2 and outputs the second pulse address signal BLANE. Thus, the signal combining part 114 generates the pulses of the first pulse address signal ALANE when the first pulse trigger part 111 outputs pulses of a high level, generates the pulses of the second pulse address signal BLANE when the second pulse trigger part 112 outputs pulses of a high level, and generates the pulses of the first and second pulse address signals ALANE and BLANE when the third pulse trigger part 113 outputs pulses of a high level.

The control signal generation section 120 is configured to generate the control signal TM_SET in response to the allocated test address signals TRG01<0> and TRG234<1>. The control signal generation section 120 includes a fourth NAND gate ND4 and a sixth inverter IV6. The fourth NAND gate ND4 receives the allocated test address signals TRG01<0> and TRG234<1>. The sixth inverter IV6 inverts the output of the fourth NAND gate ND4 and generates the control signal TM_SET. Accordingly, the control signal generation section 120 enables the control signal TM_SET when the allocated test address signals TRG01<0> and TRG234<1> have a high level.

Figure 6:
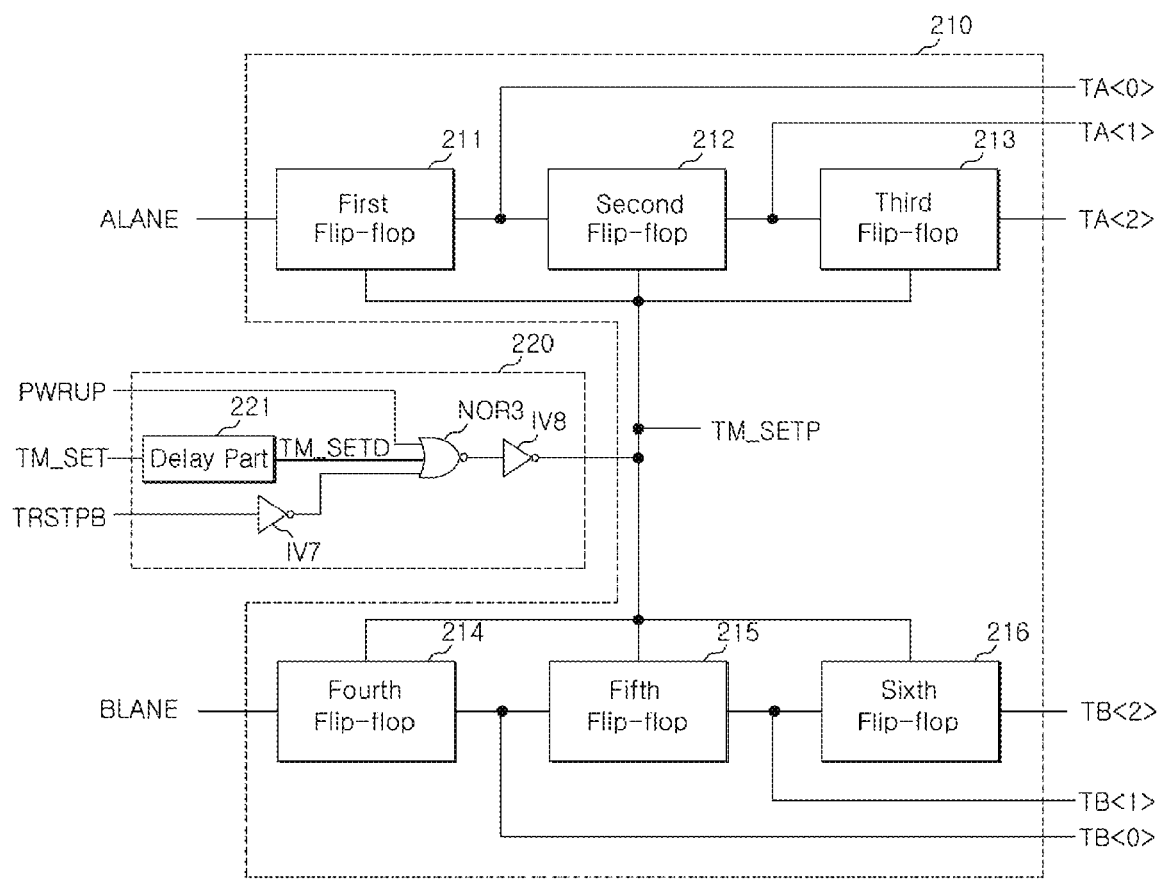
FIG. 6 is a diagram illustrating the configuration of one embodiment of a pulse address split unit shown in FIG. 3.

FIG. 6 is a diagram schematically illustrating the configuration of one embodiment of the pulse address split unit shown in FIG. 3. The pulse address split unit 200 is configured to count the number of pulses of the pulse address signals ALANE and BLANE and generate the converted test address signals TA<0:2> and TB<0:2>. The pulse address split unit 200 delays the control signal TM_SET by a predetermined time and generates a control signal pulse TM_SETP. Further, the pulse address split unit 200 delays the reset signal TRSTPB by a preselected time and generates the control signal pulse TM_SETP.

Referring to FIG. 6, the pulse address split unit 200 includes an address conversion section 210 and a pulse generation section 220. The address conversion section 210 is configured to receive the pulse address signals ALANE and BLANE and generate the converted test address signals TA<0:2> and TB<0:2>. The address conversion section 210 counts the number of pulses which are included in the pulse address signals ALANE and BLANE and generates the converted test address signals TA<0:2> and TB<0:2>. The address conversion section 210 is composed of a plurality of flip-flops which are connected in series. A first flip-flop 211 receives the first pulse address signal ALANE and outputs a signal which is changed in the logic level thereof each time the pulse of the first pulse address signal ALANE is inputted. A second flip-flop 212 receives the output of the first flip-flop 211 and outputs a signal which is changed in the logic level thereof each time the logic level of the output of the first flip-flop 211 is changed. A third flip-flop 213 receives the output of the second flip-flop 212 and outputs a signal which is changed in the logic level thereof each time the logic level of the output of the second flip-flop 212 is changed. The output of the first flip-flop 211 becomes the first bit TA<0> of the converted test address signals, the output of the second flip-flop 212 becomes the second bit TA<1> of the converted test address signals, and the output of the third flip-flop 213 becomes the third bit TA<2> of the converted test address signals.

Similarly, a fourth flip-flop 214 receives the second pulse address signal BLANE and outputs a signal which is changed in the logic level thereof each time the pulse of the second pulse address signal BLANE is inputted. A fifth flip-flop 215 receives the output of the fourth flip-flop 214 and outputs a signal which is changed in the logic level thereof each time the logic level of the output of the fourth flip-flop 214 is changed. A sixth flip-flop 216 receives the output of the fifth flip-flop 215 and outputs a signal which is changed in the logic level thereof each time the logic level of the output of the fifth flip-flop 215 is changed. The output of the fourth flip-flop 214 becomes the first bit TB<O> of the converted test address signals, the output of the fifth flip-flop 215 becomes the second bit TB<1> of the converted test address signals, and the output of the sixth flip-flop 216 becomes the third bit TB<2> of the converted test address signals. Thus, the address conversion section 210 can convert the pulse address signals ALANE and BLANE into the converted test address signals which have logic levels of plural bits.

The pulse generation section 220 is configured to receive the control signal TM_SET and the reset signal TRSTPB and generate the control signal pulse TM_SETP which is enabled when any one of the two signals TM_SET and TRSTPB is enabled. The control signal pulse TM_SETP initializes the first through sixth flip-flops 211 through 216. Namely, when the address conversion section 210 counts all of the pulses of the pulse address signals ALANE and BLANE, the control signal pulse TM_SETP resets the address conversion section 210 in order to receive next pulse address signals. Also, if the reset signal TRSTPB is enabled, the control signal pulse TM_SETP initializes the address conversion section 210.

The pulse generation section 220 includes a delay part 221, seventh and eighth inverters IV7 and IV8, and a third NOR gate NOR3. The delay part 221 delays the control signal TM_SET by the predetermined time. The predetermined time can be set to an optional time according to the desire of a designer. The seventh inverter IV7 inverts the reset signal TRSTPB. The third NOR gate NOR3 receives an output TM_SETD of the delay part 221 and the output of the seventh inverter IV7. The eighth inverter IV8 inverts the output of the third NOR gate NOR3.

Figure 7:
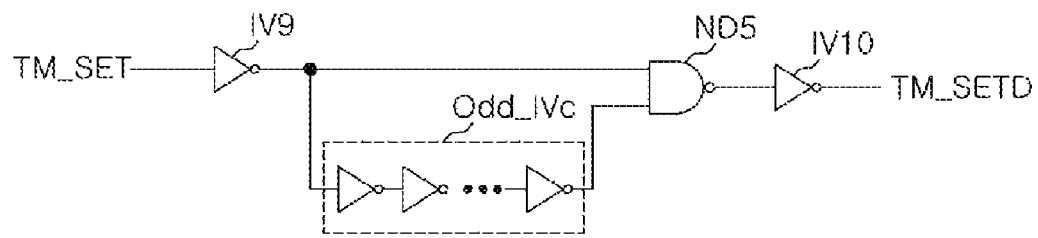
FIG. 7 is a diagram illustrating the configuration of a delay part shown in FIG. 6.

FIG. 7 is a diagram schematically illustrating the configuration according to one embodiment of the invention of the delay part shown in FIG. 6. The delay part 221 includes a ninth inverter IV9, an odd number of inverter chains Odd_IVc, a fifth NAND gate ND5, and a tenth inverter IV10. The ninth inverter IV9 inverts the control signal TM_SET. The odd number of inverter chains Odd_IVc delays the output of the ninth inverter IV9. The fifth NAND gate ND5 receives the output of the ninth inverter IV9 and the output of the inverter chains Odd_IVc. The tenth inverter IV10 inverts the output of the fifth NAND gate ND5 and generates the output signal TM_SETD. Accordingly, a time, during which the control signal TM_SET is inputted and is delayed through the elements and the control signal pulse TM_SETP is generated, can be set.

Figure 8:
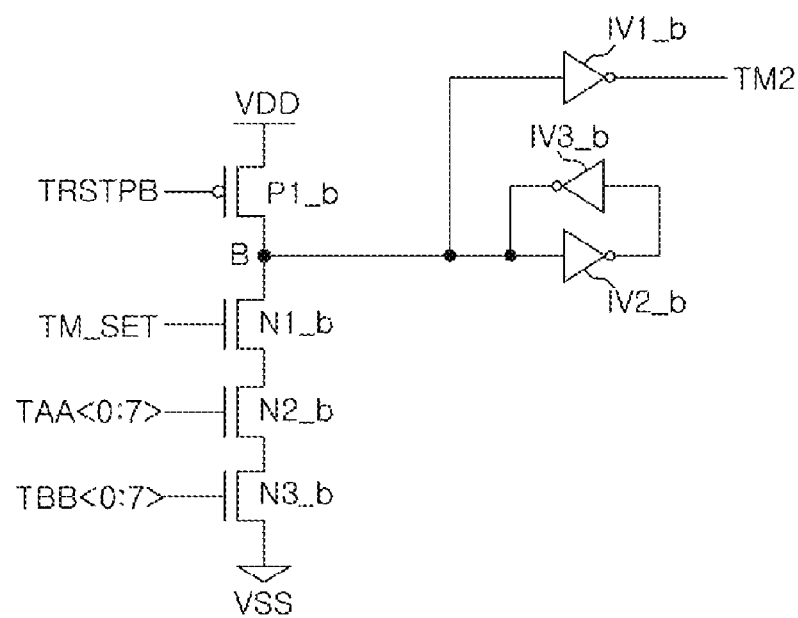
FIG. 8 is a diagram illustrating the configuration of one embodiment of a signal generation unit which constitutes a second test mode signal generation unit shown in FIG. 3.

FIG. 8 is a diagram illustrating the configuration of one embodiment of a signal generation unit which constitutes the second test mode signal generation unit shown in FIG. 3. A signal generation unit 300A includes a first PMOS transistor P1_b, first through third NMOS transistors N1_b through N3_b, and first through third inverters IV1_b through IV3_b. The first PMOS transistor P1_b has the gate which is applied with the reset signal TRSTPB, the source terminal which is applied with the external supply voltage VDD, and the drain terminal which is connected with a second node B. The first through third NMOS transistors N1_b through N3_b are connected in series between the second node B and the ground voltage terminal VSS, and respectively receive through the gates thereof the control signal TM_SET and the signals TAA<0:7> and TBB<0:7> that resulted from the decoding of the converted test address signals TA<0:2> and TB<0:2> by the decoding unit 400 of FIG. 3. The first inverter IV1_b inverts the level of the voltage applied from the second node B and generates the second test mode signal TM2. The second and third inverters IV2_b and IV3_b form a latch structure and latch the voltage level of the second node B. Therefore, the signal generation unit 300A is provided in a plural number corresponding to the number of combinations of the signals TAA<0:7> and TBB<0:7> that resulted from the decoding of the converted test address signals TA<0:2> and TB<0:2> and constitutes the second test mode signal generation unit 300.

FIG. 9 is a timing diagram illustrating operations of the test mode signal generation device in accordance with one embodiment of the present invention. Operations of the test mode signal generation device 1 in accordance with one embodiment of the present invention are described below with reference to FIGS. 3 through 9. If power is applied to a semiconductor apparatus which has the test mode signal generation device 1 and initialization is completed, the power-up signal PWRUP is disabled. Thereafter, in order to allow the semiconductor apparatus to perform a test operation, the test MRS signal TMRSP is applied in the form of pulses, and the normal MRS signal NMRSP is maintained in a disabled state.

The address signals MREG<0:6> are inputted in synchronization with the pulses of the test MRS signal TMRSP and the control unit 10 receives the address signals MREG<0:6> and generates the transmission address signals TMREG<0:6>. The address decoder 20 receives the transmission address signals TMREG<0:6> and outputs the test address signals TRG01<0:3>, TRG234<0:7> and TRG56<0:3>. In FIG. 9, if high level pulses of the test address signals TRG01<0:3>, TRG234<0:7> and TRG56<0:3> are generated, it can be understood that the address signals MREG<0:6> are inputted in a manner such that the test address signals TRG01<0:3>, TRG234<0:7> and TRG56<0:3> become a high level.

The pulse address generation unit 100 receives the test address signals TRG01<0:3>, TRG234<0:7> and TRG56<0:3>. When the first and third trigger parts 111 and 113 and the signal combining part 114 receive the pulses of the allocated test address signals TRG01<1>, TRG01<3> and TRG234<0>, they generate the pulses of the first pulse address signal ALANE. When the second and third trigger parts 112 and 113 and the signal combining part 114 receive the pulses of the allocated test address signals TRG01<2>, TRG01<3> and TRG234<0>, they generate the pulses of the second pulse address signal BLANE. In FIG. 9, it can be seen that the pulse of the test address signal TRG01<1> is inputted three times, the pulse of the test address signal TRG01<2> is inputted one time, and the pulse of the test address signal TRG01<3> is inputted two times. Accordingly, the first pulse address signal ALANE includes 5 pulses, and the second pulse address signal BLANE includes 3 pulses.

The address conversion section 210 of the pulse address split unit 200 receives the first and second pulse address signals ALANE and BLANE and generates the converted test address signals TA<0:2> and TB<0:2>. The first flip-flop 211 receives the first pulse address signal ALANE and outputs the converted test address signal TA<0> with a high level. The second flip-flop 212 receives the output of the first flip-flop 211 and outputs the converted test address signal TA<1> with a low level. The third flip-flop 213 receives the output of the second flip-flop 212 and outputs the converted test address signal TA<2> with a high level. The fourth flip-flop 214 receives the second pulse address signal BLANE and outputs the converted test address signal TB<0> with a high level. The fifth flip-flop 215 receives the output of the fourth flip-flop 214 and outputs the converted test address signal TB<1> with a high level. The sixth flip-flop 216 receives the output of the fifth flip-flop 215 and outputs the converted test address signal TB<2> with a low level.

If the address signals MREG<0:6> are inputted such that the test address signals TRG01<0> and TRG234<1> become a high level, the control signal generation section 120 of the pulse address generation unit 100 generates the control signal TM_SET. If the control signal TM_SET is enabled, a signal generation unit which is allocated with high level signals of the signals TAA<0:7> and TBB<0:7> that resulted from the decoding of the converted test address signals TA<0:2> and TB<0:2> from among the signal generation units constituting the second test mode signal generation unit 300, enables the second test mode signal TM2. Hence, the semiconductor apparatus can enter a desired test mode in response to the second test mode signal TM2.

Afterwards, if the test operation is completed and the normal MRS signal NMRSP is enabled, the reset signal TRSTPB is enabled, and the signal generation unit disables the second test mode signal TM2 in response to the reset signal TRSTPB. Consequently, the semiconductor apparatus avoids the test mode. Since the test mode signal generation device operating as described above transmits address signals by converting them into pulses, an unlimited number of test mode signals can be generated even when a small number of address signals are inputted.

FIG. 10 is a diagram illustrating a state in which the test mode signal generation device in accordance with one embodiment of the present invention is disposed in a semiconductor apparatus. In the case to where the test mode signal generation device is disposed as shown in FIG. 10, the number of global lines for generating and transmitting test mode signals becomes just 4. That is to say, global lines for transmitting the two pulse address signals ALANE and BLANE, a global line for transmitting the control signal TM_SET and a global line for transmitting the reset signal TRSTPB are used. Another test mode signal generation block 3000 may have the same configuration as the test mode signal generation block 2000. The test mode signal generation blocks generate test mode signals TM2 and TM3 using the signals transmitted through the global lines and transmit the test mode signals TM2 and TM3 to logic circuits L0 through Lk and Lk+1 through LI which use the test mode signals. The circuit components 10, 20, 40 and 100 of the test mode signal generation device generates the test mode signal TM1. The test mode signal TM1, which is generated by the circuit components 10, 20, 40 and 100 of the test mode signal generation device, is transmitted through local lines (not shown) to the logic circuits L0 through Lk and Lk+1 through LI which are adjacent to the circuit components 10, 20, 40 and 100 of the test mode signal generation device. Similarly, the test mode signals TM2 and TM3, which are generated by the test mode signal generation blocks 2000 and 3000, are transmitted through local lines (not shown) to the logic circuits L0 through Lk and Lk+1 through LI which are adjacent to the test mode signal generation blocks 2000 and 3000. As a result, because the number of global lines can be significantly decreased, the layout margin of the semiconductor apparatus which has the test mode signal generation device can be easily secured, and wiring can be implemented in a simple way.

While certain embodiments have been described above, it will be understood to those skilled in the art that the embodiments described are by way of example only. Accordingly, the device and the method for generating a test mode signal described herein should not be limited based on the described embodiments. Rather, the device and the method for generating a test mode signal described herein should only be limited in light of the claims that follow when taken in conjunction with the above description and accompanying drawings.

What is claimed is:

1. A test mode signal generation device comprising:
    a pulse address generation unit configured to convert test address signals into pulse signals to generate pulse address signals;
    a pulse address split unit configured to generate converted test address signals in response to the pulse address signals; and
    a test mode signal generation unit configured to generate a test mode signal in response to the converted test address signals.

2. The test mode signal generation device according to claim 1, wherein the pulse address generation unit is configured to change a number of pulses in the pulse address signals according to the test address signals.

3. The test mode signal generation device according to claim 1, wherein the pulse address generation unit comprises:
    an address generation section configured to generate the pulse address signals in response to the test address signals; and
    a control signal generation section configured to generate a control signal in response to the test address signals.

4. The test mode signal generation device according to claim 3, wherein the pulse address signals comprise first and second pulse address signals and wherein the address generation section comprises:
    a first trigger part configured to receive the test address signals and increase a number of pulses of the first pulse address signal;

a second trigger part configured to receive the test address signals and increase a number of pulses of the second pulse address signal;

a third trigger part configured to receive the test address signals and increase a number of pulses of the first and second pulse address signals; and a signal combining part configured to receive outputs of the first through third pulse trigger parts and output the first and second pulse address signals.

5. The test mode signal generation device according to claim 3, wherein the pulse address split unit comprises:

an address conversion section configured to count a number of pulses of the pulse address signals and generate the converted test address signals; and a pulse generation section configured to delay the control signal by a predetermined time and generate a control signal pulse.

6. The test mode signal generation device according to claim 5, wherein the address conversion section is configured to count the number of the pulses of the pulse address signals until the control signal pulse is enabled, and be initialized when the control signal pulse is enabled.

7. The test mode signal generation device according to claim 1, further comprising:

a decoding unit configured to decode the converted test address signals.

8. The test mode signal generation device according to claim 1, wherein the test mode signal generation unit comprises at least one signal generation unit configured to receive the converted test address signals and generate the test mode signal.

9. The test mode signal generation device according to claim 1, further comprising:

a control unit configured to receive address signals and a test MRS signal and generate transmission address signals, and receive a normal MRS signal and a power-up signal and generate a reset signal; and an address decoder configured to decode the transmission address signals and generate the test address signals.

10. The test mode signal generation device according to claim 9, wherein the test mode signal generation unit is configured to disable the test mode signal in response to the reset signal.

11. A test mode signal generation device comprising:

a first test mode signal generation unit configured to generate a first test mode signal in response to test address signals;

a pulse address generation unit configured to generate pulse address signals in response to the test address signals; and a test mode signal generation block configured to generate a second test mode signal in response to the pulse address signals.

12. The test mode signal generation device according to claim 11, wherein the pulse address generation unit is configured to change a number of pulses of the pulse address signals in response to the test address signals.

13. The test mode signal generation device according to claim 12, wherein the pulse address generation unit comprises:

an address generation section configured to generate the pulse address signals in response to the test address signals; and a control signal generation section configured to generate a control signal in response to the test address signals.

14. The test mode signal generation device according to claim 13, wherein the pulse address signals include first and second pulse address signals; and wherein the address generation section comprises:

a first trigger part configured to receive the test address signals and increase a number of pulses of the first pulse address signal;

a second trigger part configured to receive the test address signals and increase a number of pulses of the second pulse address signal;

a third trigger part configured to receive the test address signals and increase the number of pulses of the first and second pulse address signals; and a signal combining part configured to receive outputs of the first through third pulse trigger parts and output the first and second pulse address signals.

15. The test mode signal generation device according to claim 12, wherein the test mode signal generation block comprises:

a pulse address split unit configured to generate converted test address signals depending on the number of the pulses of the pulse address signals;

a decoding unit configured to decode the converted test address signals; and a second test mode signal generation unit configured to receive an output of the decoding unit and generate the second test mode signal.

16. The test mode signal generation device according to claim 12, wherein the pulse address split unit comprises:

an address conversion section configured to count the number of pulses of the pulse address signals and generate the converted test address signals; and a pulse generation section configured to delay the control signal by a predetermined time and generate a control signal pulse.

17. The test mode signal generation device according to claim 16, wherein the address conversion section is configured to count the number of the pulses of the pulse address signals until the control signal pulse is enabled, and be initialized when the control signal pulse is enabled.

18. The test mode signal generation device according to claim 15, wherein the second test mode signal generation unit comprises at least one signal generation unit which is configured to receive the output of the decoding unit and the control signal and generate the second test mode signal.

19. The test mode signal generation device according to claim 11, wherein the first test mode signal generation unit comprises at least one signal generation unit which is configured to receive the test address signals and generate the first test mode signal.

20. The test mode signal generation device according to claim 11, further comprising:

a control unit configured to receive address signals and a test MRS signal and generate transmission address signals, and receive a normal MRS signal and a power-up signal and generate a reset signal; and an address decoder configured to decode the transmission address signals and generate the test address signals.

21. The test mode signal generation device according to claim 20, wherein the first and second test mode signals are disabled in response to the reset signal.

22. A method of generating a test mode signal, comprising:
converting test address signals into pulse address signals having a plurality of pulses depending on logic levels of the test address signals;
transmitting the pulse address signals through global lines;
generating converted test address signals in response to the pulse address signals transmitted through the global lines; and
generating test mode signals in response to the converted test address signals.

23. The method according to claim 22, further comprising counting a number of pulses of the pulse address signals and changing logic levels of the converted test address signals depending on counting results.

24. The method according to claim 22, further comprising receiving the test address signals and generating a control signal.

25. The method according to claim 24, further comprising counting a number of pulses of the pulse address signals in response to a control signal pulse which is generated from the control signal.

26. The method according to claim 22, further comprising decoding and outputting the converted test address signals.

* * * * *